United States Patent
Ho et al.

(10) Patent No.: US 6,946,727 B2
(45) Date of Patent: Sep. 20, 2005

(54) VERTICAL ROUTING STRUCTURE

(75) Inventors: Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/723,971

(22) Filed: Nov. 25, 2003

(65) Prior Publication Data

US 2004/0155347 A1 Aug. 12, 2004

(30) Foreign Application Priority Data

Feb. 7, 2003 (TW) .................................. 92202068 U

(51) Int. Cl.[7] .............................................. H01L 32/04
(52) U.S. Cl. ........................ 257/698; 257/700; 257/773
(58) Field of Search ................................ 438/698, 774, 438/699, 708, 709, 182, 276, 502, 621; 257/698, 774, 699, 708, 709, 182, 276, 502, 621, 700, 773

(56) References Cited

U.S. PATENT DOCUMENTS 4,667,219 A * 5/1987 Lee et al. .................... 257/693
6,424,048 B1 * 7/2002 Umetsu et al. .............. 257/774
6,611,012 B2 * 8/2003 Miyamoto et al. .......... 257/286

FOREIGN PATENT DOCUMENTS

DE        19853703 A1 * 5/2000 .......... G06K/19/07

* cited by examiner

Primary Examiner—George Eckert
Assistant Examiner—N. Drew Richards
(74) Attorney, Agent, or Firm—J.C. Patents

(57) ABSTRACT

A vertical routing structure inside a substrate for connecting a pair of trace lines electrically. The trace lines are positioned on the top and bottom surface of a stack layer. The vertical routing structure includes a conductive rod and two bonding pads. The conductive rod passes through the stack layer such that the top and bottom surface of the conductive rod are also exposed on the top and bottom surface of the stack layer. In addition, a bonding pad is also attached to the top and bottom surface of the conductive rod respectively. The bonding pads are connected to the aforementioned trace lines. The two bonding pads have a transverse sectional area smaller than the transverse sectional area of the conductive rod. Thus, the vertical routing structure is able to reduce surface area needed to accommodate inter-layer connections and increase routing density within the substrate.

6 Claims, 4 Drawing Sheets

VERTICAL ROUTING STRUCTURE

CROSS-REFERENCE TO RELATED APPLICATION

This application claims the priority benefit of Taiwan application serial no. 92202068, filed on Feb. 7, 2003.

BACKGROUND OF THE INVENTION

1. Field of Invention

The present invention relates to a vertical routing structure. More particularly, the present invention relates to a vertical routing structure inside a substrate.

2. Description of Related Art

Flip chip bonding technology is a packaging technique that attaches a die to a carrier. To form a flip chip package, bumps are formed on an area array of die pads on a die and then the die is flipped over so that the bumps on the die can join up with bonding pads on the surface of the carrier both electrically and mechanically. Because flip chip bonding technology can be applied to form a chip package with a high pin count, a small package area and a short signal transmission pathway, it is one of the most popular chip packaging techniques. Note that a properly design substrate has the capacity to increase overall density of contacts and reduce size of circuits. Hence, substrate is the most commonly used carrier in a flip chip package.

FIG. 1A is a schematic cross-sectional view showing a portion of a conventional substrate having a total of six circuit layers therein altogether. As shown in FIG. 1A, the substrate 100 uses a dielectric core layer 110c as a base. Through mechanical drilling, a plurality of through holes 112a is formed in the dielectric core layer 110c. An electroplating process is carried out to coat a layer of conductive material over the interior wall of the through holes 112a and the top and bottom surface of the dielectric core layer 110c. Thereafter, resinous material is injected into the through holes 112a to consolidate the substrate 100 and form a plurality of through vias 130a (only one is shown). To simplify the description, only the process for forming the layers above the dielectric core layer 110c is discussed below.

After forming the through vias 130a, a non-patterned circuit layer 120c is formed over the circuit layer 120d. The circuit layer 120c and the circuit layer 120d are patterned to form a circuit on the top surface of the dielectric core layer 110c. Thereafter, a dielectric layer 110b is formed over the circuit layer 120c. The dielectric layer 110b is patterned to form a plurality of openings 112b (only one is shown) by conducting a photolithographic process. Conductive material is deposited into the openings 112b to form conductive vias 130b. Another non-patterned circuit layer 120b is formed over the dielectric layer 110b and then the circuit layer 120b is patterned to form bonding pads 124b thereon. The aforementioned steps for fabricating the dielectric layer 110b and the circuit layer 120b are repeated to form a dielectric layer 110a and a circuit layer 120a sequentially over the circuit layer 120b. In addition, the aforementioned steps can be repeated to form a circuit layer 120f, a dielectric layer 110d, a circuit layer 120g, a dielectric layer 110e and a circuit layer 120h sequentially over the bottom surface of the dielectric core layer 110c. Hence, a substrate 100 having a total of six circuit layers therein is built. In the six-layered substrate structure 100, the circuit layer 120c and the circuit layer 120d can be regarded as one circuit layer. Similarly, the circuit layer 120e and the circuit layer 120f can also be regarded as one circuit layer.

FIG. 1B is a top view of a portion of the substrate structure shown in FIG. 1A and FIG. 1C is a portion of the sectional view along line I—I of FIG. 1B. As shown in FIG. 1A, the circuit layer 120a and the circuit layer 120b are electrically connected through the conductive via 130b. The top end of the conductive via 130b connects to the bonding pad 124a provided by the circuit layer 120a and the bottom end of the conductive via 130b connects to the bonding pad 124b provided by the circuit layer 120b. In addition, aside from these bonding pads 124, the circuit layers 120 also provides a plurality of trace lines 122 running between the bonding pads 124.

As shown in FIGS. 1B and 1C, the opening 112b in the dielectric layer 110a is formed in a photolithographic process. Hence, the smallest diameter at the bottom end of the opening 112b is only about 60 μm. Furthermore, an alignment tolerance of about 30 μm is normally provided between the opening 112b and the bonding pad 124b during a photolithographic process of the dielectric layer 110a. Therefore, the smallest diameter of the bonding pad 124b is about 120 μm (that is, (60+30×2)μm). Additionally, to prevent possible short-circuit between the bonding pad 124 and its neighboring trace line 122 when the circuit layer 120a is patterned (normally by conducting photolithographic and etching processes), a pitch P1 not smaller than 50 μm must be set aside between the two.

With the circuit layer 120a and the circuit layer 120b designed to be electrically connected through a conductive via 130b, if the bottom end of the conductive via 120b has an outer diameter of 60 μm and the bonding pad 124b at the bottom end of the conductive via 130b has an alignment tolerance of 30 μm, an alignment tolerance of about 50 μm must be provided between the bonding pad 124b and the circuit layer 120b. In other words, the substrate 100 in FIG. 1A must provide a circular area in the horizontal plane with a diameter in excess of 220 μm (that is, 60+30×2+50×2 μm). However, as the number of signal transmission path increases, the number of conductive vias 130b and the horizontal area on the substrate 100 needed to accommodate the conductive vias 130b must be increased accordingly. Furthermore, the through holes 112a in the dielectric core layer 110c are formed by a mechanical drilling process so that the smallest diameter D1 of the through hole 112a is only about 100 μm. As a result, the smallest outer diameter of the through via 130a (including the coated layer) is about 160 μm and hence precludes any further optimization of substrate area. In other words, bringing the vias closer together to increase routing density is difficult for a substrate with conventional conductive vias or embedded vias (130b) and through vias (130a) therein.

SUMMARY OF THE INVENTION

Accordingly, one object of the present invention is to provide a vertical routing structure for electrically connecting the conductive lines in any two separate circuit layers inside a substrate so that overall area occupation of the vertical routing structures inside the substrate is reduced and routing density inside the substrate is increased.

To achieve these and other advantages and in accordance with the purpose of the invention, as embodied and broadly described herein, the invention provides a vertical routing structure inside a substrate for electrically connecting any two conductive lines. The two conductive lines are respectively located at a top surface and a bottom surface of a stack layer within the substrate. The vertical routing structure includes a conductive rod and two bonding pads. The conductive rod passes through the stack layer such that the top surface and the bottom surface of the conductive rod are exposed at the top surface and the bottom surface of the stack layer respectively. In addition, the two bonding pads are located on the top surface and the bottom surface of the conductive rod and that the two bonding pads are electrically connected to the two aforementioned conductive lines. Moreover, area of a transverse section through the each bonding pad is smaller than a transverse section through the conductive rod.

Accordingly, the vertical routing structure of this invention can be applied to a substrate. Through a conductive rod and two end-attached bonding pads, area occupation of connective structure within the substrate is reduced and routing density is increased. In addition, the steps needed to route between any substrate layers and fabricate the substrate are simplified. Hence, overall production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
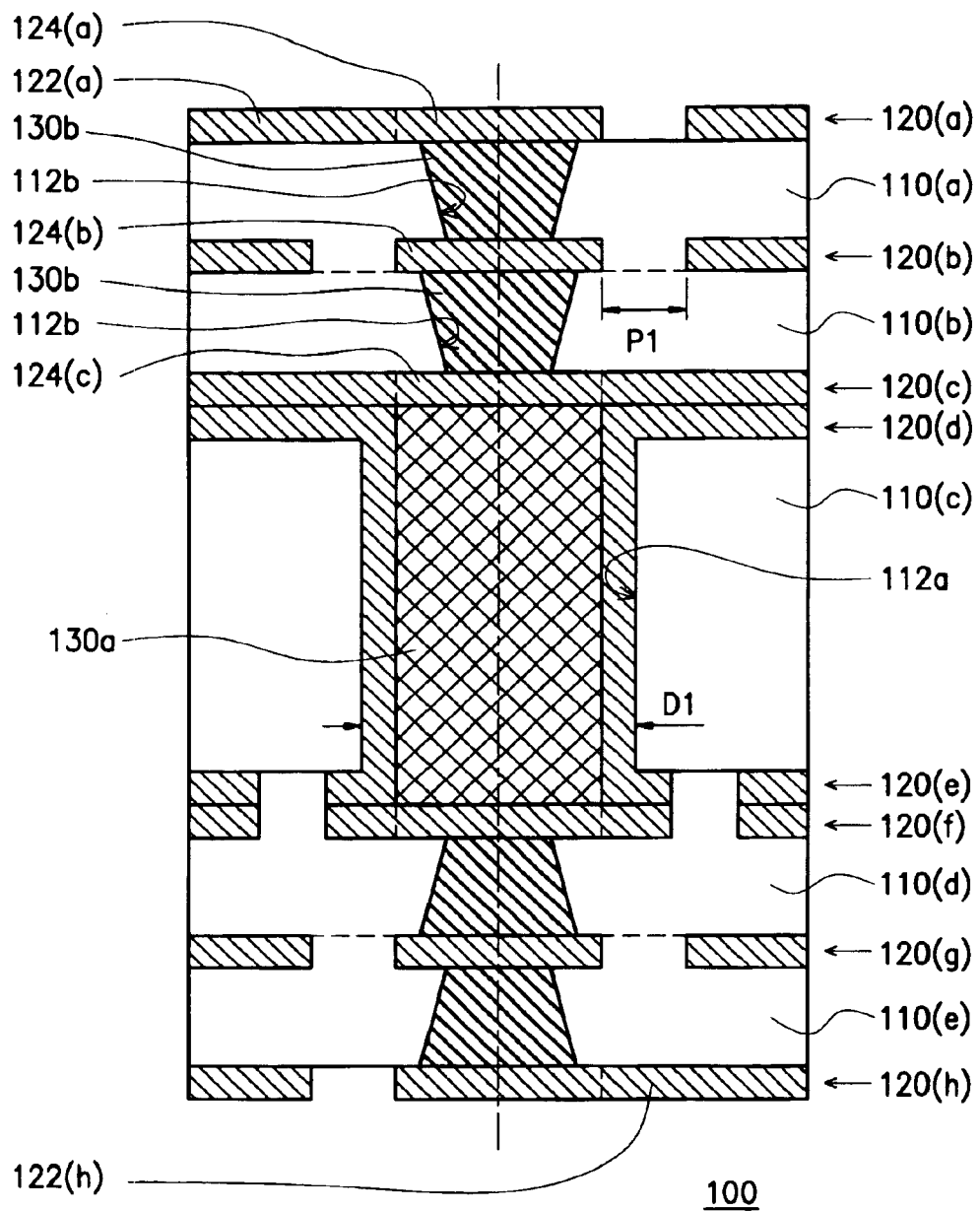
FIG. 1A is a schematic cross-sectional view showing a portion of a conventional substrate having a total of six circuit layers therein altogether.
Figure 1B:
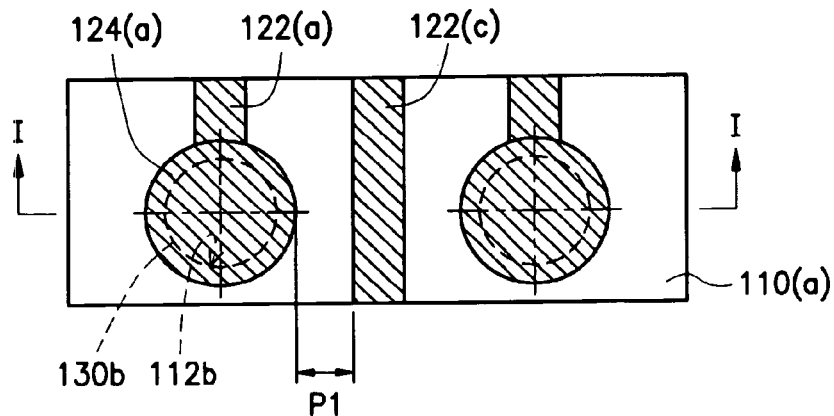
FIG. 1B is a top view of a portion of the substrate structure shown in FIG. 1A.
Figure 1C:
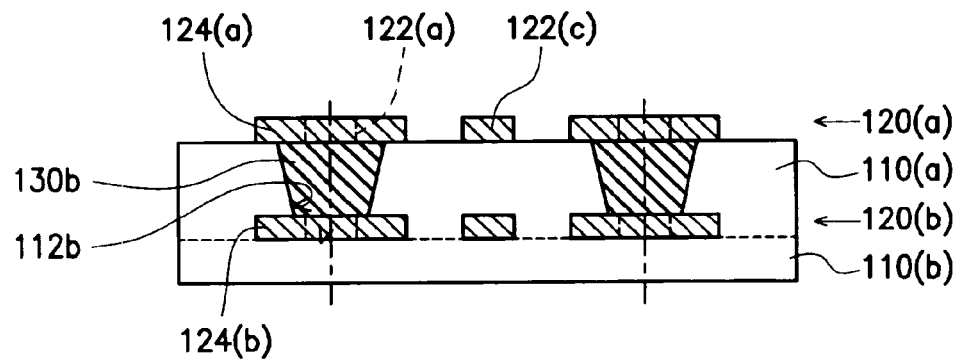
FIG. 1C is a portion of the sectional view along line I—I of FIG. 1B.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
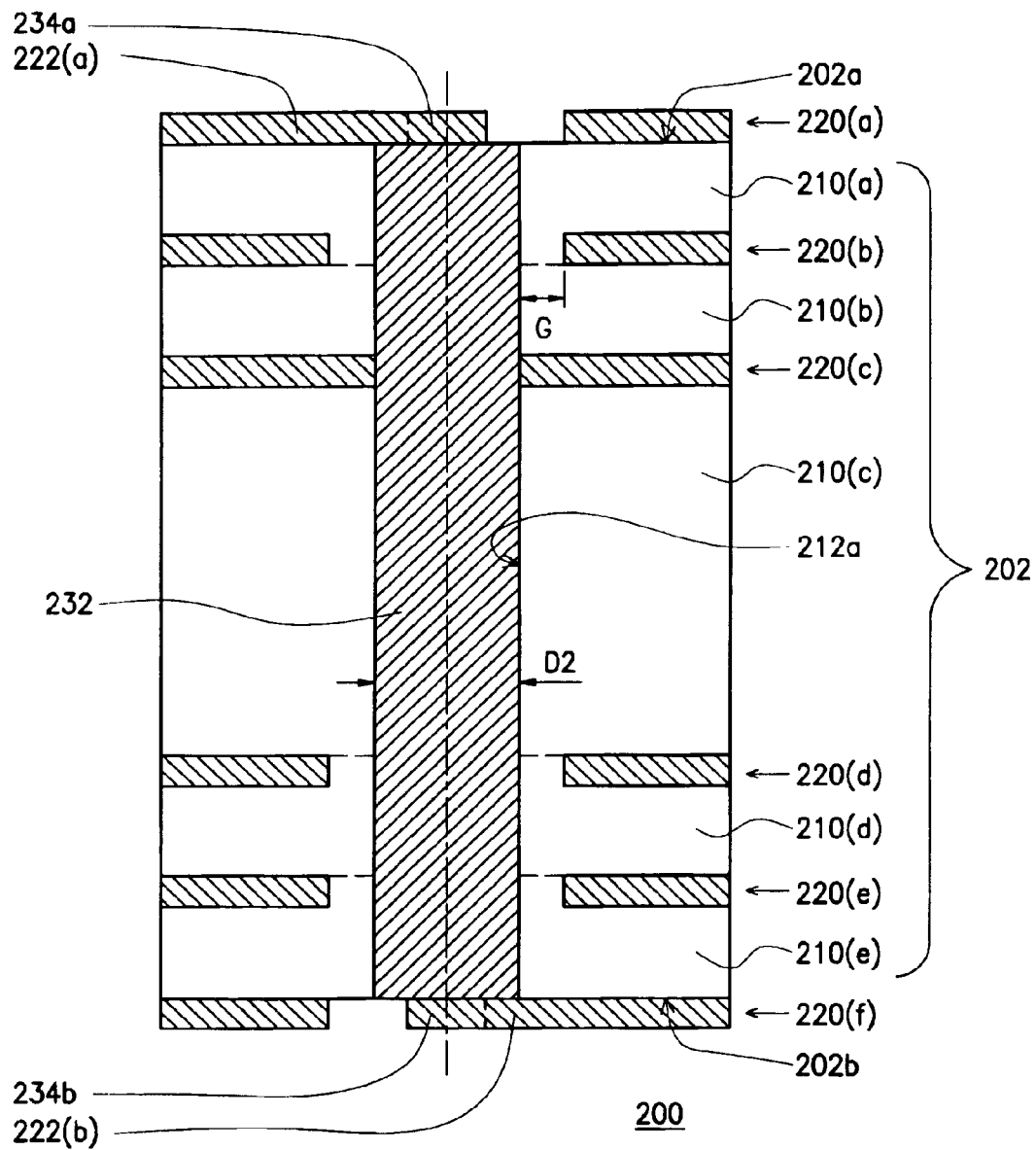
FIG. 2A is a schematic cross-sectional view showing a portion of a substrate with a vertical routing structure according to one preferred embodiment of this invention.

FIG. 2A is a schematic cross-sectional view showing a portion of a substrate with a vertical routing structure according to one preferred embodiment of this invention. The vertical routing structure is applied to a substrate 200 including, for example, a carrier for flip chip bonding or a printed circuit board. In this embodiment, the substrate 200 also has six circuit layers inside altogether. However, the number of circuit layers inside the substrate is not limited to six. In fact, the vertical routing structure can be applied to a substrate with at least two circuit layers. The substrate 200 mainly comprises of stack of dielectric layers 210 and patterned circuit layers 220. The substrate 200 is formed either by adding the dielectric layer 210 and the patterned circuit layer 220 one at a time or stacking the dielectric layers 210 and the patterned circuit layers 220 altogether and laminating the layers to form a stack layer 202 in one step. Note that the stack layer 202 in the substrate 200 includes a dielectric layer 210a, a circuit layer 220b, a dielectric layer 210b, a circuit layer 220c, a dielectric layer 210c, a circuit layer 220d, a dielectric layer 210d, a circuit layer 220e and a dielectric layer 210e.

After fabricating the stack layer 202, a through hole 212a is formed in the stack layer 202 by mechanical drilling or laser drilling. The through hole 212a passes through the stack layer 202 with the interior wall surface having surface connection with the top surface 202a and the bottom surface 202b of the stack layer 202. Thereafter, conductive material is deposited into the space within the through hole 212a to form a conductive rod 232. The conductive rod 232 can be simply conductive material or Cu plating layer with plugged conductive material. The top surface and the bottom surface of the conductive rod 232 are exposes alongside the top surface 202a and the bottom surface 202b of the stack layer 202. Finally, a patterned circuit layer 220a and a patterned circuit layer 220b are formed on the top surface 202a and the bottom surface 202b of the stack layer 202 respectively. The circuit layer 220a includes a plurality of bonding pads 234a and a plurality of trace lines 222a. Similarly, the circuit layer 220b includes a plurality of bonding pads 234b and a plurality of trace lines 222b. Note that the vertical routing structure according to this invention includes the conductive rod 232, the bonding pad 234a and the bonding pad 234b. The bonding pad 234a with electrical connection to the trace line 222a is set up on the top surface of the conductive rod 232. Area of a transverse section through the bonding pad 234a is smaller than a transverse section through the conductive rod 232. Similarly, the bonding pad 234b with electrical connection to the trace line 222b is set up on the bottom surface of the conductive rod 232. Thus, the trace line 222a in the circuit layer 220 connected to the bonding pad 234a is routed vertically down through the conductive rod 232 to the bonding pad 234b in the circuit layer 220f and distributed horizontally to other areas (other bonding pads) via the trace line 222b.

Consideration regarding the power source or ground connection within the substrate 200 demands the provision of a large area of accommodating a common power layer or common ground layer. For example, the circuit layer 220c in FIG. 2A serves as a common power source layer or a common ground layer. Hence, there is no need to form another hole in the circuit layer 220c (power source layer or ground layer). In other words, the conductive rod 232 is directly connected to the circuit layer 220c. Furthermore, through the bonding pad 234a and the trace line 222a in the circuit layer 220a, the circuit layer 220c can spread out horizontally at the top surface 202a of the stack layer 202. Similarly, through the bonding pad 234b and the trace line 222b in the circuit layer 220f, the circuit layer 220a can spread out horizontally at the bottom surface 202b of the stack layer 202.

To improve reliability of electrical connection, a metallic layer (not shown) can be selectively coated over the interior surface of the through hole 212a prior to filling the through hole 212a with conductive material to form the conductive rod 232. With the coated metallic layer on the interior wall of the through hole 212a, electrical connection between the side edge of the conductive rod 232 and a circuit layer (for example, the circuit layer 220c) is ensured. Note that the bonding pad 234a and the bonding pad 234b on the top and bottom surface of the conductive rod 232 are affected by the additional metallic coating.

Figure 2B:
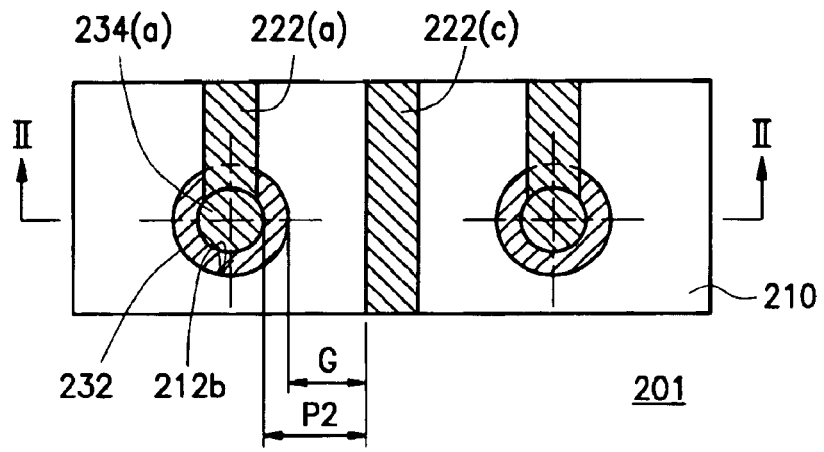
FIG. 2B is a top view of a portion of the substrate structure shown in FIG. 2A.
Figure 2C:
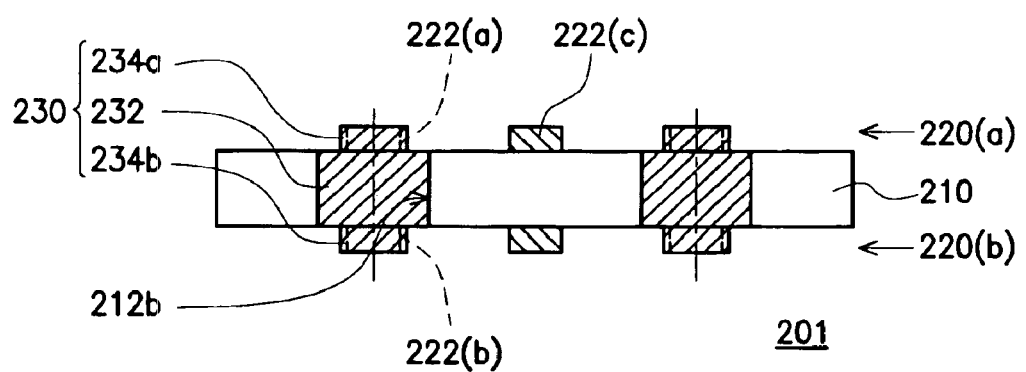
FIG. 2C is a portion of the sectional view along line II—II of FIG. 2B.

The vertical routing structure according to this invention can be applied to fabricate a substrate with multiple circuit layers (for example, six circuit layers within the substrate 200 in FIG. 2A). However, the structure can also be applied to fabricate a substrate with just two circuit layers as shown in FIGS. 2B and 2C. FIG. 2B is a top view of a portion of the substrate structure shown in FIG. 2A; and FIG. 2C is a portion of the sectional view along line II—II of FIG. 2B. The substrate 201 includes a patterned circuit layer 220a, a dielectric layer 210 and a patterned circuit layer 220b. The circuit layer 220a and the circuit layer 220b are located on the top surface and the bottom surface of the dielectric layer 210. The circuit layers 220 each includes a plurality of bonding pads 234 and a plurality of trace lines 222. A conductive rod 232 passes through the dielectric layer 210 to connect the respective bonding pads 234 at each end. Note that the vertical routing structure 230 in FIGS. 2B and 2C includes the conductive rod 232, the bonding pad 234a and the bonding pad 234b. The trace line 222a in the circuit layer 220a on the top surface is able to connect electrically with the trace line 222b on the bottom surface through the bonding pad 234a, the conductive rod 232 and the bonding pad 234b. In addition, aside form a stack of alternately laid dielectric layers 210 and circuit layers 220 as shown in FIG. 2A, the stack may include just a single dielectric layer 210 (as shown in FIG. 2C).

As shown in FIG. 2A, the conductive rod 232 in the vertical routing structure is capable of connecting at least two circuit layers (for example, the circuit layer 210a, the circuit layer 210c and the circuit layer 210f). Therefore, the complicated steps needed to form the vertical routing design depicted in FIG. 1A can all be replaced. In other words, there is no need to connect the trace line 122a through the two conductive vias 130b, the through via 130a and another the two conductive vias 130b to the conductive trace line 122h. Hence, the number of processing steps and hence cost of producing the substrate is greatly reduced.

In FIG. 2A, because the through hole 212 in the stack layer 202 is formed by mechanical drilling or laser drilling, diameter of the through hole 212b can be reduced to a minimum of about 100 $\mu$m. That means, the outer diameter D2 of the conductive rod 232 can be reduced to 100 $\mu$m. Compared with the bonding pads 124a and 124b with an outer diameter exceeding 100 $\mu$m in FIG. 1A, the bonding pads 234a and 234b in FIG. 2A have a much smaller diameter. With a smaller horizontal extension for the bonding pads 234a and 234b, routing density on the substrate 200 can be further increased.

With the through hole 212b in the stack layer 202 formed by mechanical drilling or laser drilling and area of a transverse section through the bonding pads 234 smaller than the top surface of the conductive rod 232, distance of separation G (about 30 $\mu$m and shown in FIG. 2A) between the conductive rod 232 and the circuit layer 220b can be smaller than the distance of separation P1 (about 50 $\mu$m and shown in FIG. 1A) between the bonding pad 124 and the trace line 122c. Hence, the substrate 200 in FIG. 2A has to provide a circular horizontal sectional area with a diameter of about 160 $\mu$m (100+2×30 $\mu$m) compared with a circular area with a diameter of about 220 $\mu$m in the conventional substrate 100. All these mean that the conductive rod 232 occupies a smaller area within the substrate 200 than the conductive vias 130 in the conventional substrate 100. Ultimately, density routing circuits within the substrate 200 can be increased.

Furthermore, since the transverse sectional area of the bonding pad 234a is smaller than the conductive rod 232 as shown in FIG. 2B, pitch P2 between the bonding pad 234a and the trace line 222c is less important than pitch G between the top surface (or top end) of the conductive rod 232 and the trace line. In other words, alignment accuracy between the conductive rod 232 and the bonding pad 234a or alignment accuracy between the conductive rod 232 and the trace line 222c is of major importance in the routing design because the bonding pad 234a and the trace line 222c are fabricated from the circuit layer 220a in the same process.

In summary, the vertical routing structure according to this invention has the following advantages:

1. The vertical routing structure is formed in the substrate using simple processing steps. Hence, production cost of the substrate is greatly reduced.
2. The conductive rod is formed by mechanical drilling or laser drilling the substrate to form a through hole and then filling the through hole with conductive material. Since sectional area of the conductive rod is smaller than the sectional area of a conventional vertical routing structure, routing density in the substrate is increased.
3. The vertical routing structure actually comprises of a conductive rod and a pair of bonding pads. The vertical structure has the capacity not only to connect neighboring or non-neighboring circuit layers electrically, but also has the capacity to join up two or more circuit layers simultaneously. Thus, routing inside the substrate is very much simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A vertical routing structure inside a substrate for connecting a first trace line and a second trace line electrically, wherein the substrate has a stack layer, a first patterned circuit layer, and a second patterned circuit layer, the first patterned circuit layer on a first surface of the stack layer forms the first trace line, and the second patterned circuit layer on a second surface of the stack layer forms the second trace line, the vertical routing structure comprising:

a conductive rod that passes through the stack layer such that a first surface and a corresponding second surface of the conductive rod are exposed on the first surface and the second surface of the stack layer;

a first bonding pad on the first surface of the conductive rod and formed of the first circuit layer, wherein the first bonding pad is connected to the first trace line and the transverse sectional area of the first bonding pad is smaller than the transverse sectional area of the first surface of the conductive rod; and a second bonding pad on the second surface of the conductive rod and formed of the second circuit layer wherein the second bonding pad is connected to the second trace line.

2. The vertical routing structure of claim 1, wherein the transverse sectional area of the second bonding pad is also smaller than the transverse sectional area of the second surface of the conductive rod.

3. The vertical routing structure of claim 1, wherein the stack layer includes a dielectric layer.

4. The vertical routing structure of claim 1, wherein the stack layer includes a plurality of dielectric layer and at least a patterned circuit layer, and the circuit layer is positioned between any two neighboring dielectric layers.

5. The vertical routing structure of claim 4, wherein a side edge of the conductive rod is electrically connected to the circuit layer.

6. The vertical routing structure of claim 4, wherein a side edge of the conductive rod is not electrically connected to the circuit layer.

* * * * *